United States Patent
Zhao et al.

(10) Patent No.: US 8,557,407 B2
(45) Date of Patent: *Oct. 15, 2013

(54) LOW RESISTANCE TUNNELING MAGNETORESISTIVE SENSOR WITH NATURAL OXIDIZED DOUBLE MGO BARRIER

(75) Inventors: Tong Zhao, Fremont, CA (US); Kunliang Zhang, Milpitas, CA (US); Hui Chuan Wang, Pleasanton, CA (US); Yu-Hsia Chen, Mountain View, CA (US); Min Li, Dublin, CA (US)

(73) Assignee: Headway Technologies, Inc., Milpitas, CA (US)

( * ) Notice: Subject to any disclaimer, the term of this patent is extended or adjusted under 35 U.S.C. 154(b) by 479 days.

This patent is subject to a terminal disclaimer.

(21) Appl. No.: 12/806,164

(22) Filed: Aug. 6, 2010

(65) Prior Publication Data

US 2010/0304185 A1  Dec. 2, 2010

Related U.S. Application Data

(62) Division of application No. 11/280,523, filed on Nov. 16, 2005, now Pat. No. 7,780,820.

(51) Int. Cl.
*G11B 5/39* (2006.01)

(52) U.S. Cl.
USPC ............... 428/811.1; 428/811.5; 360/324.11; 360/324.2

(58) Field of Classification Search
None
See application file for complete search history.

(56) References Cited

U.S. PATENT DOCUMENTS

| | | | |
|---|---|---|---|
| 6,347,049 B1 | 2/2002 | Childress et al. | |
| 6,560,077 B2 * | 5/2003 | Fujiwara et al. | ........... 360/324.1 |
| 6,737,691 B2 | 5/2004 | Asao | |
| 6,756,128 B2 | 6/2004 | Carey et al. | |
| 6,819,532 B2 | 11/2004 | Kamijo | |
| 6,826,022 B2 | 11/2004 | Umetsu | |
| 6,828,260 B2 | 12/2004 | Sharma et al. | |
| 6,841,395 B2 | 1/2005 | Linn et al. | |
| 6,887,717 B2 | 5/2005 | Hiramoto et al. | |

(Continued)

OTHER PUBLICATIONS

"230% room-tempertaure magnetoresistance in CoFeB/MgO/CoFeB magnetic tunnel junctions," by David D. Djayaprawira et al., Applied Physics Letters 86, 092502 (2005), 2005 American Institute of Physics, pp. 1-3.

(Continued)

*Primary Examiner* — Kevin Bernatz
(74) *Attorney, Agent, or Firm* — Saile Ackerman LLC; Stephen B. Ackerman

(57) ABSTRACT

A high performance TMR sensor is fabricated by incorporating a tunnel barrier having a Mg/MgO/Mg configuration. The 4 to 14 Angstroms thick lower Mg layer and 2 to 8 Angstroms thick upper Mg layer are deposited by a DC sputtering method while the MgO layer is formed by a NOX process involving oxygen pressure from 0.1 mTorr to 1 Torr for 15 to 300 seconds. NOX time and pressure may be varied to achieve a MR ratio of at least 34% and a RA value of 2.1 ohm-um². The NOX process provides a more uniform MgO layer than sputtering methods. The second Mg layer is employed to prevent oxidation of an adjacent ferromagnetic layer. In a bottom spin valve configuration, a Ta/Ru seed layer, IrMn AFM layer, CoFe/Ru/CoFeB pinned layer, Mg/MgO/Mg barrier, CoFe/NiFe free layer, and a cap layer are sequentially formed on a bottom shield in a read head.

7 Claims, 2 Drawing Sheets

(56) References Cited

U.S. PATENT DOCUMENTS

| | | | |
|---|---|---|---|
| 7,252,852 B1* | 8/2007 | Parkin | 427/131 |
| 7,479,394 B2 | 1/2009 | Horng et al. | |
| 7,606,010 B2* | 10/2009 | Parkin | 360/324.2 |
| 7,920,363 B2* | 4/2011 | Pinarbasi | 360/324.2 |
| 8,031,441 B2* | 10/2011 | Zhang et al. | 360/324.1 |
| 2003/0128483 A1* | 7/2003 | Kamijo | 360/324.11 |
| 2004/0047086 A1* | 3/2004 | Wang et al. | 360/324.12 |
| 2005/0052787 A1* | 3/2005 | Funayama et al. | 360/314 |

OTHER PUBLICATIONS

"Giant Tunneling magnetoresistance effect in low-resistance CoFeB/MgO (001)/CoFeB magnetic tunnel junctions for read-head applications," by Koji Tsunekawa et al., Applied Physics Letters 87, 072503 (2005), 2005 American Institute of Physics, pp. 1-3.

"Giant tunnelling magnetoresistance at room temperature with MgO (100) tunnel barriers," by Stuart S. P. Parkin et al., 2004 Nature Publishing Group, published online: Oct. 31, 2004; doi:10.1038/nmat1256, pp. 862-867, nature materials/vol. 3/Dec. 2004/ www.nature.com/naturematerials.

"Giant room-temperature magnetoresistance in single-crystal Fe/MgO/Fe magnetic tunnel junctions," by Shinji Yuasa et al., 2004 Nature Publishing Group, published online: Oct. 31, 2004; doi;10.1038/nmat1257, pp. 868-871, nature materials/vol. 3/Dec. 2004/ www.nature.com/naturematerials.

* cited by examiner

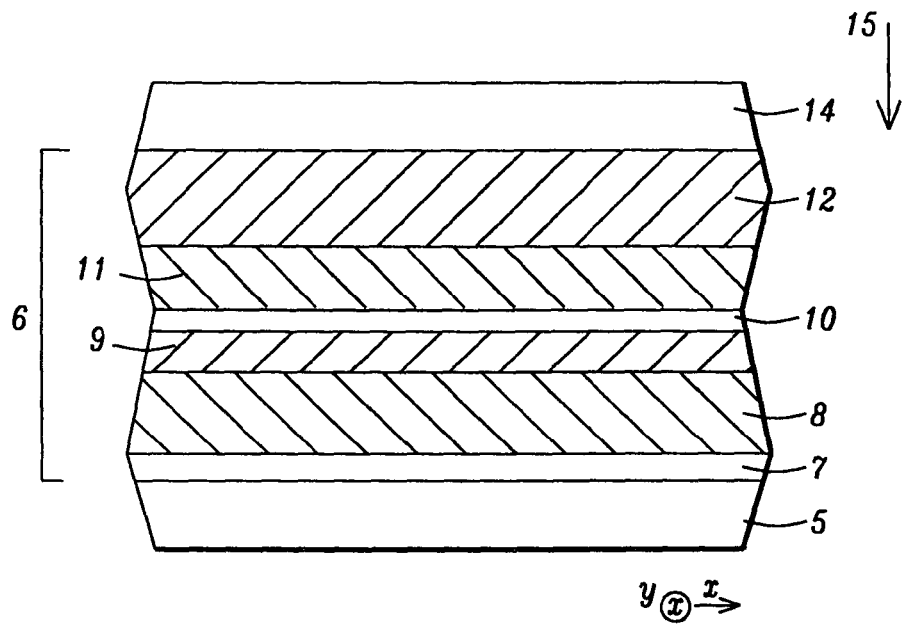
FIG. 1 – Prior Art
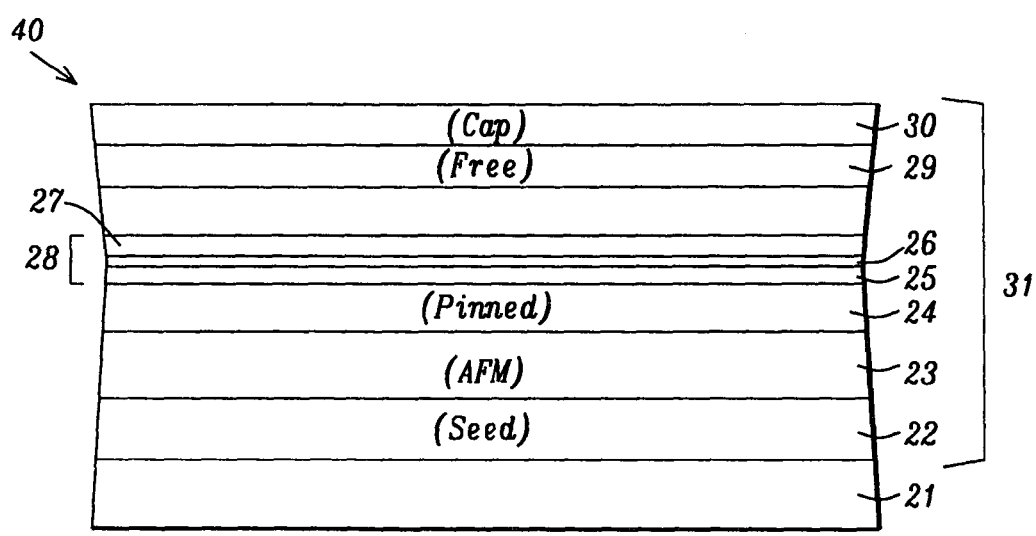
FIG. 2

LOW RESISTANCE TUNNELING MAGNETORESISTIVE SENSOR WITH NATURAL OXIDIZED DOUBLE MGO BARRIER

This is a Divisional application of U.S. patent application Ser. No. 11/280,523, filed on Nov. 16, 2005 now U.S. Pat. No. 7,780,820, which is herein incorporated by reference in its entirety, and assigned to a common assignee.

RELATED PATENT

This application is related to U.S. Pat. No. 7,479,394; assigned to a common assignee.

FIELD OF THE INVENTION

The invention relates to a high performance tunneling magnetoresistive (TMR) sensor in a read head and a method for making the same, and in particular, to a method of forming a MgO barrier between a pinned layer and free layer that improves the MR ratio and tunnel barrier uniformity while achieving a low resistance×area (RA) value.

BACKGROUND OF THE INVENTION

A TMR sensor serves as a memory element in magnetic devices such as Magnetic Random Access Memory (MRAM) and a magnetic read head. In FIG. 1, a TMR sensor 6 is shown as a stack of layers that has a configuration in which two ferromagnetic layers are separated by a thin non-magnetic dielectric layer. In a magnetic read head, the TMR sensor 6 is formed between a bottom shield 5 and a top shield 14. The bottom (seed) layer 7 in the TMR sensor 6 is generally comprised of one or more seed layers that promote a smooth and dense crystal growth in overlying layers. Above the seed layer 7 is an anti-ferromagnetic (AFM) pinning layer 8 and a first ferromagnetic layer that is a "pinned" layer 9 on the AFM layer. The thin tunnel barrier layer 10 above the pinned layer 9 is generally comprised of a dielectric material such as AlOx that may be formed by first depositing an Al layer and then performing an in-situ oxidation. The tunnel barrier layer 10 must be extremely uniform in thickness and oxidation state since small AlOx thickness variations or slight oxidation differences result in large variations in resistance that degrade device performance. A ferromagnetic "free" layer 11 is formed on the tunnel barrier layer 10 and is typically less than 50 Angstroms thick. At the top of the TMR element is a cap layer 12. In a MRAM, the TMR sensor is formed between a bottom conductor and a top conductor The MTJ stack in FIG. 1 has a so-called bottom spin valve configuration. Alternatively, an MTJ stack may have a top spin valve configuration in which a free layer is formed on a seed layer followed by sequentially forming a tunnel barrier layer, a pinned layer, AFM layer, and a cap layer.

The pinned layer 9 has a magnetic moment that is fixed in the y direction by exchange coupling with the adjacent AFM layer 8 that is also magnetized in the y direction. The free layer 11 has a magnetic moment that is either parallel or anti-parallel to the magnetic moment in the pinned layer. The tunnel barrier layer 10 is so thin that a current through it can be established by quantum mechanical tunneling of conduction electrons. The magnetic moment of the free layer may switch in response to external magnetic fields generated by passing a current through the bottom shield 5 and top shield 14. It is the relative orientation of the magnetic moments between the free and pinned layers that determines the tunneling current and therefore the resistance of the tunneling junction. When a sense current 15 is passed from the top shield 14 to the bottom shield 5 (or top conductor to bottom conductor in a MRAM device) in a direction perpendicular to the planes of the TMR layers (CPP designation), a lower resistance is detected when the magnetization directions of the free and pinned layers are in a parallel state ("1" memory state) and a higher resistance is noted when they are in an anti-parallel state or "0" memory state. Alternatively, a TMR sensor may be configured as a current in plane (CIP) structure which indicates the direction of the sense current.

A TMR sensor is currently the most promising candidate for replacing a giant magnetoresistive (GMR) sensor in upcoming generations of magnetic recording heads. An advanced TMR sensor may have a cross-sectional area of about 0.1 microns×0.1 microns at the air bearing surface (ABS) plane of the read head. The advantages of a TMR sensor are a higher MR ratio and the preference for CPP geometry for high recording density. A high performance TMR sensor requires a low RA (area×resistance) value, high MR ratio, a soft free layer with low magnetostriction ($\lambda$), a strong pinned layer, and low interlayer coupling through the barrier layer. The MR ratio is dR/R where R is the minimum resistance of the TMR sensor and dR is the change in resistance observed by changing the magnetic state of the free layer. A higher dR/R improves the readout speed. For high recording density or high frequency applications, RA must be reduced to about 1 to 3 ohm-um$^2$. As a consequence, MR ratio drops significantly. To maintain a reasonable signal-to-noise (SNR) ratio, a novel magnetic tunneling junction (MTJ) with a MR ratio higher than that provided by a conventional AlOx barrier layer is desirable.

A very high MR ratio has been reported by Yuasa et. al in "Giant room-temperature magnetoresistance in single crystal Fe/MgO/Fe magnetic tunnel junctions", Nature Materials 3, 868-871 (2004) and is attributed to coherent tunneling. Parkin et al in "Giant tunneling magnetoresistance at room temperature with MgO (100) tunnel barriers", Nature Materials 3, 862-867 (2004) demonstrated that an MR ratio of about 200% can be achieved with epitaxial Fe(001)/MgO(001)/Fe(001) and polycrystalline FeCo(001)/MgO(001)/(Fe$_{70}$Co$_{30}$)$_{80}$B$_{20}$ MTJs at room temperature. In addition, Djayaprawira et. al described a high MR ratio of 230% with advantages of better flexibility and uniformity in "230% room temperature magnetoresistance in "CoFeB/MgO/CoFeB magnetic tunnel junctions", Physics Letters 86, 092502 (2005). However, RA values in the MTJs mentioned above are in the range of 240 to 10000 ohm-um$^2$ which is too high for read head applications. Tsunekawa et. al in "Giant tunneling magnetoresistance effect in low resistance CoFeB/MgO(001)/CoFeB magnetic tunnel junctions for read head applications", Applied Physics Letters 87, 072503 (2005) found a reduction in RA by inserting a DC-sputtered metallic Mg layer between a bottom CoFeB layer and rf-sputtered MgO. The Mg layer improves the crystal orientation of the MgO(001) layer when the MgO (001) layer is thin. The MR ratio of CoFeB/Mg/MgO/CoFeB MTJs can reach 138% at RA=2.4 ohm-um$^2$. The idea of metallic Mg insertion was initially disclosed by Linn in U.S. Pat. No. 6,841,395 to prevent oxidation of the bottom electrode (CoFe) in a CoFe/MgO (reactive sputtering)/NiFe structure.

Although a high MR ratio and low RA have been demonstrated in MTJs having a MgO barrier layer, there are still many issues to be resolved before such configurations can be implemented in a TMR sensor of a read head. For example, the annealing temperature needs to be lower than 300° C. for read head processing, and rf-sputtered MgO barriers make control of RA mean and uniformity more difficult than with conventional DC-sputtered and subsequently naturally oxidized AlOx barriers. Moreover, a CoFe/NiFe free layer is preferred over CoFeB for low λ and soft magnetic properties but when using a CoFe/NiFe free layer in combination with a MgO barrier, the MR ratio will degrade to very near that of a conventional AlOx MTJ. Thus, a TMR sensor is needed that incorporates a MgO barrier without compromising any desirable properties such as high MR ratio, a low RA value, and low magnetostriction.

A three step barrier layer formation process for a TMR sensor is described in U.S. Pat. No. 6,841,395 and involves sequentially depositing a Mg layer and an oxygen doped Mg film on a ferromagnetic layer and then performing an oxygen treatment. In U.S. Pat. No. 6,828,260, a UV light is used to irradiate a MgO tunnel barrier layer through a transparent overlayer and thereby activate unreacted oxygen in the barrier layer to react with Mg and form a uniformly oxygenated tunnel barrier layer.

A barrier layer comprised of $TiO_xN_y$ and MgO is disclosed in U.S. Pat. No. 6,756,128. In U.S. Pat. No. 6,737,691, a tunneling barrier layer such as MgO is described with a thickness of <10 Angstroms. No composite barrier layer is disclosed. In U.S. Pat. No. 6,347,049, $MgO/Al_2O_3/MgO$ and $Al_2O_3/MgO/Al_2O_3$ are disclosed as tunnel barrier layers having low RA values.

A natural oxidation process is used to form a tunnel barrier layer comprised of a single oxide layer in U.S. Pat. No. 6,887,717, U.S. Pat. No. 6,826,022, and in U.S. Pat. No. 6,819,532.

SUMMARY OF THE INVENTION

One objective of the present invention is to provide a TMR sensor with a natural oxidized MgO barrier layer to improve the uniformity of the barrier thickness and oxidation compared with rf-sputtered or reactive sputtered MgO barriers.

A second objective of the present invention is to provide a TMR sensor having a substantially higher MR ratio than realized with sensors comprised of an AlOx barrier layer while achieving a low RA value and low magnetostriction required for advanced read head applications.

A further objective of the present invention is to provide a method of forming a TMR sensor that satisfies the first and second objectives and is cost effective.

According to a first embodiment, these objectives are achieved by forming a TMR sensor on a suitable substrate such as a bottom shield in a read head. The TMR sensor may have a bottom spin valve configuration comprised of a seed layer, AFM layer, and pinned layer which are formed sequentially on the bottom shield. The pinned layer preferably has an AP2/coupling/AP1 configuration in which the coupling layer is Ru and the AP1 layer is made of CoFeB or a CoFeB/CoFe composite. A key feature is that the barrier layer formed on the AP1 layer has a composite structure comprised of a Mg/MgO/Mg stack. The Mg layers are formed by a DC magnetron sputtering method and the MgO layer is made by a natural oxidation process of the lower Mg layer. Above the tunnel barrier layer is formed a free layer and then a cap layer as the uppermost layer in the TMR sensor. A CoFe/NiFe free layer is preferred for low magnetostriction.

Typically, a TMR stack of layers is laid down in a sputtering system. All of the layers may be deposited in the same sputter chamber. However, the natural oxidation process on the lower Mg layer to form a MgO layer thereon is preferably done in an oxidation chamber within the sputtering system. The TMR stack is patterned by a conventional method prior to forming a top shield on the cap layer.

BRIEF DESCRIPTION OF THE DRAWINGS

FIG. 1 is a cross-sectional view showing a conventional TMR sensor that is formed between a bottom shield and a top shield in a magnetic read head.

FIG. 2 is a cross-sectional view depicting a TMR stack having a barrier layer comprised of a middle MgO layer and upper and lower Mg layers according to one embodiment of the present invention.

DETAILED DESCRIPTION OF THE INVENTION

Figure 3:
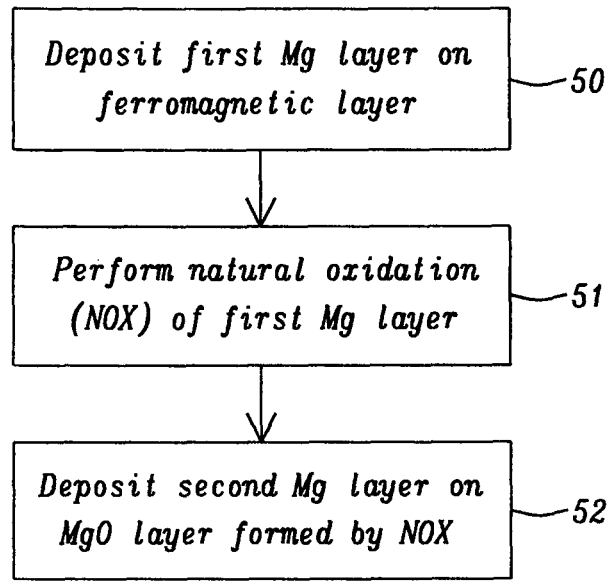
FIG. 3 is a process flow that depicts the steps involved in forming a Mg/MgO/Mg barrier layer according to one embodiment of the present invention.

The present invention is a high performance TMR sensor having a barrier layer comprised of a Mg/MgO/Mg stack and a method for making the same wherein the MgO layer may be formed by a natural oxidation process of the lower Mg layer. While the exemplary embodiment depicts a TMR sensor in a read head, the present invention may be employed in other devices based on a tunneling magnetoresistive element such as MRAM structures. The TMR sensor may have a bottom spin valve, top spin valve, or multilayer spin value configuration as appreciated by those skilled in the art. The drawings are provided by way of example and are not intended to limit the scope of the invention. For example, the drawings are not necessarily drawn to scale and the relative sizes of various elements may differ compared with those in an actual device.

Referring to FIG. 2, a portion of a partially formed TMR read head 40 of the present invention is shown from the plane of an air bearing surface (ABS). There is a substrate 21 that in one embodiment is a bottom lead otherwise known as a bottom shield (S1) which may be a NiFe layer about 2 microns thick that is formed by a conventional method on a substructure (not shown). It should be understood that the substructure is typically comprised of a first gap layer disposed on a wafer made of AlTiC, for example.

A TMR stack 31 is formed on the substrate 21 and in the exemplary embodiment has a bottom spin valve configuration wherein a seed layer 22, AFM layer 23, and a pinned layer 24 are sequentially formed on the substrate as the bottom portion of the TMR stack. The seed layer 22 which has a thickness of about 10 to 100 Angstroms is preferably a Ta/Ru composite but Ta, Ta/NiCr, Ta/Cu, or Ta/Cr may be used, instead. The seed layer 22 serves to promote a smooth and uniform grain structure in overlying layers. Above the seed layer 22 is an AFM layer 23 used to pin the magnetization direction of the overlying pinned layer 24. The AFM layer 23 has a thickness from 40 to 300 Angstroms and is preferably comprised of IrMn. Optionally, one of MnPt, NiMn, OsMn, RuMn, RhMn, PdMn, RuRhMn, or MnPtPd may be employed as the AFM layer.

The pinned layer 24 may have a synthetic anti-parallel (SyAP) configuration (not shown) represented by AP2/Ru/AP1. The AP2 layer (outer pinned layer) is formed on the AFM layer 23 and may be made of CoFe with a composition of about 10 atomic % Fe and with a thickness of about 10 to 50 Angstroms. The magnetic moment of the AP2 layer is pinned in a direction anti-parallel to the magnetic moment of the AP1 layer. A slight difference in thickness between the AP2 and AP1 layers produces a small net magnetic moment for the SyAP pinned layer 24 along the easy axis direction of the TMR sensor to be patterned in a later step. Exchange coupling between the AP2 layer and the AP1 layer is facilitated by a coupling layer that is preferably comprised of Ru with a thickness of from 3 to 9 Angstroms although Rh or Ir may be used instead of Ru. In a preferred embodiment, the AP1 layer (inner pinned layer) is a $Co_{1-X-Y}Fe_XB_Y$ layer wherein x is from about 5 to 95 atomic % and y is from about 5 to 30 atomic % and is formed on a Ru coupling layer which is about 7.5 Angstroms thick. The $Co_{1-X-Y}Fe_XB_Y$ layer has a thickness from about 10 to 80 Angstroms. The $Co_{1-X-Y}Fe_XB_Y$ layer is amorphous and provides a more uniform pinned layer 24 than would result if a CoFe layer, for example, were employed as the AP1 layer. Optionally, the AP1 layer may be a multilayer structure such as $CoFeB/Co_{1-V}Fe_V$ wherein v is from 10 to 90 atomic % and the $Co_{1-V}Fe_V$ thickness is from about 5 to 20 Angstroms with the total AP1 layer thickness from 10 to 80 Angstroms. In this optional configuration, the uniformity of the pinned layer may not be as high as in the preferred embodiment, but the TMR properties such as MR ratio and RA value are similar to the preferred embodiment.

Note that "inner pinned layer" is meant to indicate the portion of the pinned layer that is closest to the barrier layer and "outer pinned layer" is meant to signify the portion of the pinned layer farthest from the barrier layer. In the exemplary embodiment that features a bottom spin valve configuration, the barrier layer 28 having a Mg/MgO/Mg stack of layers 25-27 is formed on the AP1 portion of the pinned layer 24. In a top spin valve configuration, the TMR stack according to the present invention would involve the sequential deposition of a seed layer, free layer, Mg/MgO/Mg barrier layer, pinned layer with an AP1/Ru/AP2 configuration, an AFM layer, and a cap layer on the substrate. In a top spin valve, the AP1 layer (inner pinned layer) is disposed on the upper Mg layer in the Mg/MgO/Mg stack.

A key feature of the present invention according to the preferred embodiment is the formation of a barrier layer 28 having a Mg/MgO/Mg configuration on the inner (AP1) portion of the pinned layer 24. A process flow diagram is provided in FIG. 3. The first or lower Mg layer 25 is preferably between 4 and 14 Angstroms thick and is deposited (step 50) on a ferromagnetic layer in a DC sputtering chamber of a sputtering system such as an Anelva C-7100 sputter deposition system which includes ultra high vacuum DC magnetron sputter chambers and at least one oxidation chamber. In one aspect relating to a bottom spin valve configuration, the ferromagnetic layer in step 50 is the pinned layer 24. Alternatively, in a top spin valve configuration (not shown), the ferromagnetic layer is a free layer. Typically, the sputter deposition process involves an argon sputter gas and a base pressure between $5 \times 10^{-8}$ and $5 \times 10^{-9}$ torr. Each sputter chamber has multiple targets which are low pressure discharge cathodes. A lower pressure enables more uniform films to be deposited.

The second step in the barrier layer formation sequence is a natural oxidation (NOX) process (step 51) of the first Mg layer 25 to form a MgO layer 26 thereon. The NOX process is performed in an oxidation chamber of the sputter deposition system using an oxygen pressure of 0.1 mTorr to 1 Torr for about 15 to 300 seconds. In the exemplary embodiment, no heating or cooling is applied to the oxidation chamber during the NOX process. The resulting MgO layer 26 has a thickness of about 5 to 12 Angstroms. It should be noted that oxygen pressures below 0.1 mTorr are not recommended because of tool limitations. For an oxygen pressure >1 Torr, a low RA value (RA<5 ohm-um$^2$) cannot be obtained with a reasonable NOX time of greater than about 10 seconds. In a related patent application HMG05-043 which is herein incorporated by reference in its entirety, a tunneling barrier layer comprised of an upper MgO layer made by an NOX process and a lower MgO layer formed by a ROX process is described.

The present invention anticipates that a Mg/MgO/Mg barrier layer 28 according to a second embodiment of the present invention could be formed by depositing the MgO layer 26 on the first Mg layer 25 with a rf-sputtering or reactive sputtering method. It should be understood that the performance of a TMR sensor fabricated with a barrier layer comprised of sputtered MgO will not be as desirable as one made according to the preferred embodiment of this invention. For example, the inventors have observed that the final RA uniformity (1σ) of 0.6 um circular devices is more than 10% when the MgO tunnel barrier layer is rf-sputtered and less than 3% when the MgO tunnel barrier is formed by DC sputtering a Mg layer followed by a NOX process.

Referring again to FIG. 3, the partially formed TMR stack 31 is returned to a sputter deposition chamber in the sputter deposition system (step 52) and a second Mg layer 27 is deposited on the MgO layer 26 by a DC sputtering process. The second Mg layer 27 has a thickness between 2 and 8 Angstroms and serves to protect the subsequently deposited free layer from oxidation. It is believed that excessive oxygen accumulates at the top surface of the MgO layer 26 as a result of the NOX process and this oxygen can oxidize a free layer that is formed directly on the MgO portion of the barrier layer. Likewise, a pinned layer formed directly on the MgO portion of a barrier layer in a top spin valve configuration would be subject to oxidation and a Mg/MgO/Mg barrier stack of the present invention would protect the pinned layer. Note that the RA and MR ratio for the TMR sensor 31 may be adjusted by varying the thickness of the two Mg layers 25, 27 and by varying the natural oxidation time and pressure. For example, a thicker MgO layer resulting from longer oxidation time and/or higher pressure would increase the RA value.

Returning to FIG. 2, a free layer 29 is formed on the barrier layer 28 and is preferably comprised of $Co_{1-W}Fe_W/Ni_{1-Z}Fe_Z$ wherein w is from about 10 to 90 atomic % and z is from about 5 to 70 atomic %. Optionally, the free layer 29 may be a multilayered structure of alloys including at least two of the elements Co, Fe, Ni, and B. The free layer 29 has a thickness in the range of 10 to 90 Angstroms. Above the free layer is a cap layer 30 that may have a Ru/Ta/Ru or Ru/Zr/Ru configuration, for example. In one embodiment, the free layer 29 and cap layer 30 are deposited in the same sputtering chamber as the layers 22-25 and second Mg layer 27. Optionally, all of the sputter deposited layers in the TMR stack 31 may be deposited in more than one sputter chamber in the same sputter deposition system or mainframe.

Once the TMR stack 31 is complete, the partially formed read head 40 may be annealed in a vacuum oven within the range of 250° C. to 300° C. with a 8000 Oe applied magnetic field for about 2 to 10 hours to set the pinned layer and free layer magnetization directions. It should be understood that in some cases, depending upon the time and temperature involved in the anneal process, the Mg/MgO/Mg tunnel barrier may become a uniform MgO tunnel barrier layer as unreacted oxygen diffuses into the adjacent Mg layers.

Figure 4:
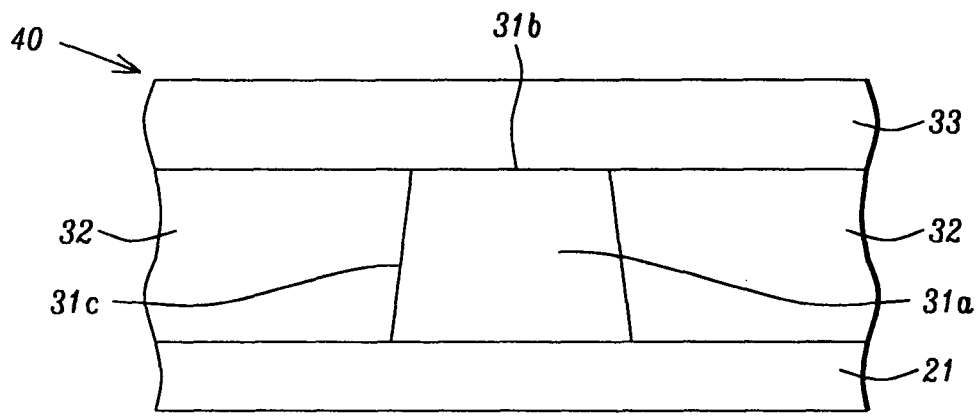
FIG. 4 is a cross-sectional view of a TMR read head having a TMR sensor interposed between a top shield and bottom shield and formed according to the present invention.

Next, the TMR stack 31 is patterned by following a conventional process sequence. For example, a photoresist layer (not shown) may be applied on the cap layer 30. After the photoresist layer is patterned, an ion beam etch (IBE) or the like is used to remove underlying layers in the TMR stack that are exposed by openings in the photoresist layer. The etch process stops on the bottom shield 21 to give a TMR sensor 31a with a top surface 31b and sidewalls 31c as shown in FIG. 4. Thereafter, an insulating layer 32 may be deposited along the sidewalls of the TMR sensor 31a. The photoresist layer is subsequently removed by a lift off process.

A top lead otherwise known as a top shield 33 is then deposited on the insulating layer 32 and TMR element 31a. Similar to the bottom shield 21, the top shield 33 may also be a NiFe layer about 2 microns thick. The TMR read head 40 may be further comprised of a second gap layer (not shown) disposed on the top shield 33.

An experiment was conducted to demonstrate the improved performance achieved by implementing a Mg/MgO/Mg barrier layer in a TMR sensor. A TMR stack of layers was fabricated according to the exemplary embodiment described previously and has a Ta/Ru/IrMn/CoFe/Ru/FeCoB/Mg/MgO/Mg/CoFe/NiFe/cap configuration. The Mg/MgO/Mg barrier is comprised of a 7 Angstrom thick lower Mg layer that was subjected to a NOX process and a 3 Angstrom thick upper Mg layer. The thicknesses in Angstroms of the other layers are given in parentheses: Ta(20)/Ru(20) seed layer; IrMn (70) AFM layer; CoFe (19) outer pinned layer; Ru (7.5) coupling layer; $Fe_{56}Co_{24}B_{20}$ (20) inner pinned layer; CoFe(10)/NiFe(40) free layer; and Ru(10)/Ta (60) cap layer. The TMR stack was formed on a NiFe shield and was annealed under vacuum at 280° C. for 5 hours with an applied field of 8000 Oe. The advantages of the present invention are that a high MR ratio of greater than 30% can be achieved simultaneously with a low RA value (<5 ohm-$um^2$) and low magnetostriction which is a significant improvement over conventional TMR sensors (MTJs) based on AlOx barrier layers. In this example, a MR ratio of 34% was achieved with a magnetostriction of $2 \times 10^{-6}$ and a RA value of 2.1 ohm-$um^2$ on a 0.6 um circular device. It should be understood that the magnetostriction value may be adjusted by varying the thickness or composition of the CoFe and NiFe layers in the free layer.

The inventors have previously fabricated a similar TMR sensor with the same configuration as in the aforementioned experiment except the upper Mg layer in the barrier layer was omitted. In other words, a single MgO barrier layer was fabricated rather than a double MgO barrier layer as in the present invention. As a result, the MR ratio decreased to about 10% at an RA value of 2 ohm-$um^2$. Thus, the combination of high MR ratio and low RA is realized only by implementing the additional Mg layer in the Mg/MgO/Mg barrier as disclosed herein. Furthermore, the Mg/MgO/Mg barrier layer provides a higher MR ratio at low RA values than realized with conventional AlOx barrier layers. As mentioned earlier, the second Mg layer is advantageously used to prevent oxidation of the adjacent free layer which in the exemplary embodiment is a CoFe layer. Those skilled in the art will appreciate that other ferromagnetic materials that serve as a free layer (or pinned layer) will likewise be protected from oxidation by the second Mg layer in the tunnel barrier.

Another advantage of the present invention is that the Mg/MgO/Mg tunnel barrier is cost effective. Compared with a process previously practiced by the inventors, the TMR sensor disclosed herein involves only an additional Mg layer which does not require any new sputtering targets or sputter chambers. Moreover, the low temperature anneal enabled by the CoFe/NiFe free layer means that the annealing process can be kept the same as for GMR sensors that are currently produced. Therefore, there is no change in process flow and related processes compared with current manufacturing schemes.

Yet another advantage is that the MgO layer in the present invention has a more uniform thickness and oxidation state because it is formed by a natural oxidation method rather than by a sputtering process. As a result, the tunneling resistance of the barrier layer is controlled within tighter limits and better control leads to higher performance.

While this invention has been particularly shown and described with reference to, the preferred embodiment thereof, it will be understood by those skilled in the art that various changes in form and details may be made without departing from the spirit and scope of this invention.

We claim:
1. A TMR sensor in a magnetic device, comprising:
(a) a synthetic anti-parallel (SyAP) pinned layer with an AP2/Ru/AP1 configuration wherein an AP1 layer is comprised of CoFeB or CoFeB/CoFe; and
(b) a tunnel barrier layer formed on the AP1 layer, said tunnel barrier layer is comprised of a lower Mg layer, a middle MgO layer, and an upper Mg layer.

2. The TMR sensor of claim 1 wherein the AP2 layer is made of CoFe, and the AP1 layer is about 10 to 80 Angstroms thick and is comprised of $Co_{1-X-Y}Fe_XB_Y$ wherein x is from about 5 to 95 atomic % and y is from about 5 to 30 atomic %, said TMR sensor is further comprised of a free layer formed on said upper Mg layer.

3. The TMR sensor of claim 1 wherein the AP2 layer is made of CoFe, and the AP1 layer has a multilayer structure comprised of $CoFeB/Co_{1-V}Fe_V$ wherein v is from about 10 to 90 atomic % and the thickness of the $Co_{1-V}Fe_V$ layer is from about 5 to 20 Angstroms.

4. The TMR sensor of claim 2 wherein the free layer is comprised of $Co_{1-W}Fe_W/Ni_{1-Z}Fe_Z$ wherein w is from about 10 to 90 atomic % and z is from about 5 to 70 atomic %.

5. The TMR sensor of claim 1 wherein the lower Mg layer has a thickness of about 4 to 14 Angstroms and the upper Mg layer has a thickness from about 2 to 8 Angstroms.

6. The TMR sensor of claim 1 wherein the MgO layer has a thickness that is adjusted to provide a MR ratio of at least 34% and a RA value of about 2 ohm-$um^2$.

7. The TMR sensor of claim 1 wherein said magnetic device is a MRAM or read head and the TMR sensor has a bottom spin valve configuration in which a Ta/Ru seed layer, IrMn AFM layer, CoFe/Ru/CoFeB pinned (ferromagnetic) layer, said barrier layer, a CoFe/NiFe free layer, and a cap layer are sequentially formed on a substrate.

* * * * *